(12) United States Patent
Nara

(10) Patent No.: US 6,377,617 B1
(45) Date of Patent: Apr. 23, 2002

(54) REAL-TIME SIGNAL ANALYZER

(75) Inventor: Akira Nara, Tokyo (JP)

(73) Assignee: Sony/Tektronix Corporation, Tokyo (JP)

( * ) Notice: Subject to any disclaimer, the term of this patent is extended or adjusted under 35 U.S.C. 154(b) by 0 days.

(21) Appl. No.: 09/319,426

(22) PCT Filed: Dec. 9, 1997

(86) PCT No.: PCT/JP97/04511

§ 371 Date: Jun. 4, 1999

§ 102(e) Date: Jun. 4, 1999

(87) PCT Pub. No.: WO98/26298

PCT Pub. Date: Jun. 18, 1998

(30) Foreign Application Priority Data

Dec. 11, 1996 (JP) .............................. 8-346519

(51) Int. Cl.[7] ................................. H04B 3/46
(52) U.S. Cl. ........................ 375/224; 375/346
(58) Field of Search ............... 375/347, 224, 375/324, 340, 354; 370/210, 232; 708/403, 821, 404, 406, 321; 382/280; 342/196; 704/203; 702/77; 324/76.21; 364/576; 455/190.1, 434, 455, 68

(56) References Cited

U.S. PATENT DOCUMENTS

| 5,479,440 A | * 12/1995 | Esfahani ................. 375/346 |
| 5,576,978 A | 11/1996 | Kiiayoshi .................. 702/77 |
| 5,697,078 A | * 12/1997 | Peterson et al. ......... 455/190.1 |
| 5,760,308 A | * 6/1998 | Beall et al. .................. 73/644 |
| 5,764,763 A | * 6/1998 | Jensen et al. .................. 380/6 |

FOREIGN PATENT DOCUMENTS

EP    0 285 238    10/1988

* cited by examiner

Primary Examiner—Chi Pham
Assistant Examiner—Emmanuel Bayard
(74) Attorney, Agent, or Firm—Smith-Hill and Bedell

(57) ABSTRACT

This invention relates to a new type real time signal analyzer that has both merits of a conventional real time FFT analyzer and a conventional vector signal analyzer and clears both demerits of them. This apparatus has a FFT processor 14 for FFT processing time domain data in real time, a FIFO memory 22 for delaying the time domain data before the FFT process, and a double port memory 24 for storing FFT processed frequency data from the FFT processor 14 and delayed time domain data read out from the FIFO memory 22. The delay time of the FIFO memory 22 is set up according to the process time of the FFT processor 14 that allows to secure time correspondence between the delayed time domain data and the frequency domain data. Therefore it respectively provides the data of the time domain and the frequency domain in real time at the same time that are synchronized each other.

9 Claims, 2 Drawing Sheets

REAL-TIME SIGNAL ANALYZER

TECHNICAL FIELD

The present invention relates to a signal analyzer that can analyze a signal in real time, more particularly to a new type real time signal analyzer that has both merits of a conventional real time FFT analyzer and a conventional vector signal analyzer and clears both demerits of them.

BACKGROUND ART

A real time FFT analyzer is a measurement apparatus that continuously transform a signal under test by FFT process in real time without dead time in order to extract and analyze the spectrum domain component from the signal.

FIG. 3 shows a schematic block diagram of such a conventional FFT analyzer that provides real time process. An analog to digital converter (ADC) 10 converts a signal under test into a digital signal and a digital down converter (DDC) 12 decimates the digital signal for substantial frequency conversion. A FFT processor 14 transforms the resultant time domain digital data, for example, 1024 points of the time domain data as one frame, into frequency domain digital data according to the FFT process. The DDC 12 has a sequential data buffer (not shown) in the output portion that stores the one frame data sequentially and continuously. The FFT processor 14 can complete the FFT process of the previous frame during the storage of the new data into the data buffer that allows real time data analysis. A memory 16 stores the output data of the FFT processor 14 sequentially.

A trigger circuit 18 can set up a trigger condition to the data in the memory 16. If the trigger condition is satisfied, the trigger circuit 18 output a trigger signal to read out the data that qualifies the trigger condition. A CPU 20 wholly controls the real time analyzer. The data read out from the memory 16 are sent to a display circuit (not shown) to display them on a screen (not shown). This real time FFT analyzer can extract spectrum (frequency component) in real time without dead time and could catch an event occurrence that meets an arbitrary trigger condition.

FIG. 4 shows a schematic block diagram of an example of a conventional vector signal analyzer. Elements corresponding to that of FIG. 3 have the same reference symbols. A memory 16 stores output data of a DDC 12 and the stored data are transferred to a digital signal processor (DSP) 17 to execute analytic processes such as a FFT process. The vector signal analyzer of this type is suitable for demodulating various modulated vector signals and provides a flexible signal analysis because it executes the various analytic processes after storing the time domain data in the memory 16.

The real time FFT analyzer of FIG. 3, however, must transform the frequency domain data in the memory by the inverse FFT process in order to reproduce the time domain data for analyzing the digital modulated signal in time domain displays such as "eye pattern" or "constellation". Besides, a FFT process multiplied by a window function makes it impossible to completely reproduce the original time domain signal.

One the other hand, it is difficult for the vector signal analyzer of FIG. 4 to produce the frequency domain data in real time because the data in the memory are the time domain data. Therefore it is difficult to catch a transient fluctuation of the frequency spectrum.

As described, the real time FFT analyzer and the vector signal analyzer are used in different ways and the merits and the demerits of them counter each other.

Therefore what is desired is to provide a real time signal analyzer that has both merits of the conventional real time FFT analyzer and the conventional vector signal analyzer and clears both demerits of them.

DISCLOSURE OF INVENTION

A real time signal analyzer according to the present invention has a FFT processor that transform time domain data by FFT process in real time, a delay means for delaying the time domain data, a memory means for storing frequency domain data transformed by the FFT process from the FFT processor, and a memory means for storing delayed time domain data read out from the delay means.

Delay time of the delay means is set up according to the process time of the FFT processor, then time correspondence between the delayed time domain data and the frequency domain data is secured. Therefore it generates the time domain data and the frequency domain data in real time respectively but having the time correspondence each other.

BEST MODE FOR CARRYING OUT THE INVENTION

Figure 1:
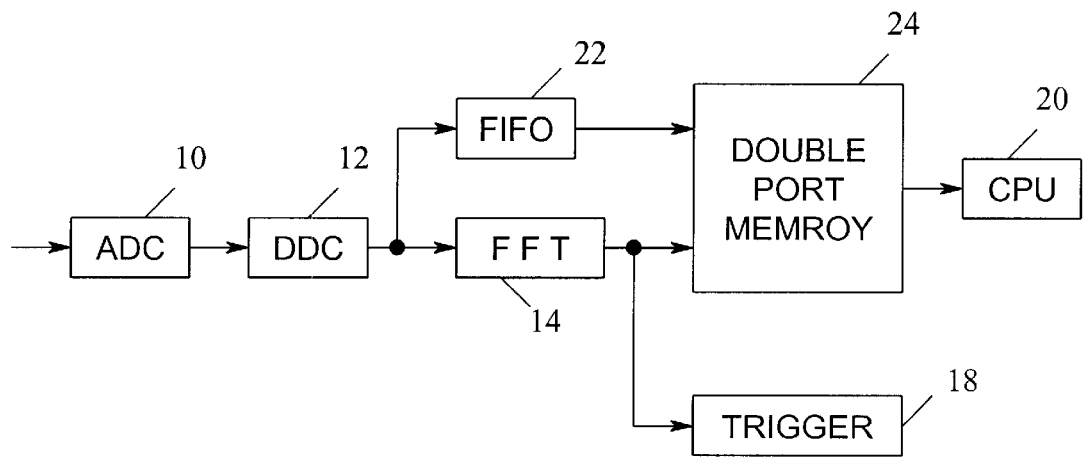
FIG. 1 is a schematic block diagram showing a preferred example embodying the invention.

FIG. 1 shows a schematic block diagram of a preferred example embodying the invention. An analog to digital converter (ADC) 10 converts a signal under test into digital data and a digital down converter (DDC) 12 decimates the data for frequency conversion. At this time, 1024 points, for example, of the time domain data are produced as one frame data in real time. This data length of one frame is just an example and an arbitrary value may be selected according to specification of data display or an analytic function.

A FFT processor 14 transforms the time domain data by FFT process and, at this time, multiplies it by a window function if necessary. On the other hand, the time domain data, or the output of the DDC 12, are also provided to a first in first out memory (FIFO) 22. The FIFO 22 is a delay means for delaying the time domain data with corresponding to the time required to transform the time domain data by the FFT process. The output data of the FFT processor 14 is frequency domain data showing spectrum component of the signal under test, and this frequency domain data is stored in a double port memory 24 through the first port. The delayed time domain data from the FIFO 22 is stored in the double port memory 24 through the second port. The delayed time domain data and the frequency domain data stored in the double port memory 24 are provided to a display circuit (not shown) and a display screen (not shown) under the control of a CPU 20 and displayed in appropriate styles. The display circuit and the display screen may be a CRT, a liquid crystal display or any other proper devices. Besides, a printer or a plotter is connected to be out the analyzed data on a paper.

It is not indispensable for the present invention to use the double port memory 24 as described above. The delayed time domain data and the frequency domain data could be stored in different memories. The key of the present invention is not the memory construction but the simultaneous availability of the time domain data and the frequency domain data that are synchronized. This allows the CPU 20 an arbitrary analysis of the time domain data and the frequency domain data that have time correspondence each other. The present invention also provides reliable catches of transient and incidental signal fluctuations etc. because the time domain data and the frequency domain data are acquired without time crack, or dead time. Besides, because the time correspondence between the time domain data and the frequency domain data is secured, it is easy to compare them and watch how they change by transient change or incidental fluctuation with, for example, displaying their waveforms on the screen. It should be remarkable that the comparison and observation described above used to be wholly impossible for the conventional real time FFT analyzer or vector signal analyzer.

Figure 2:
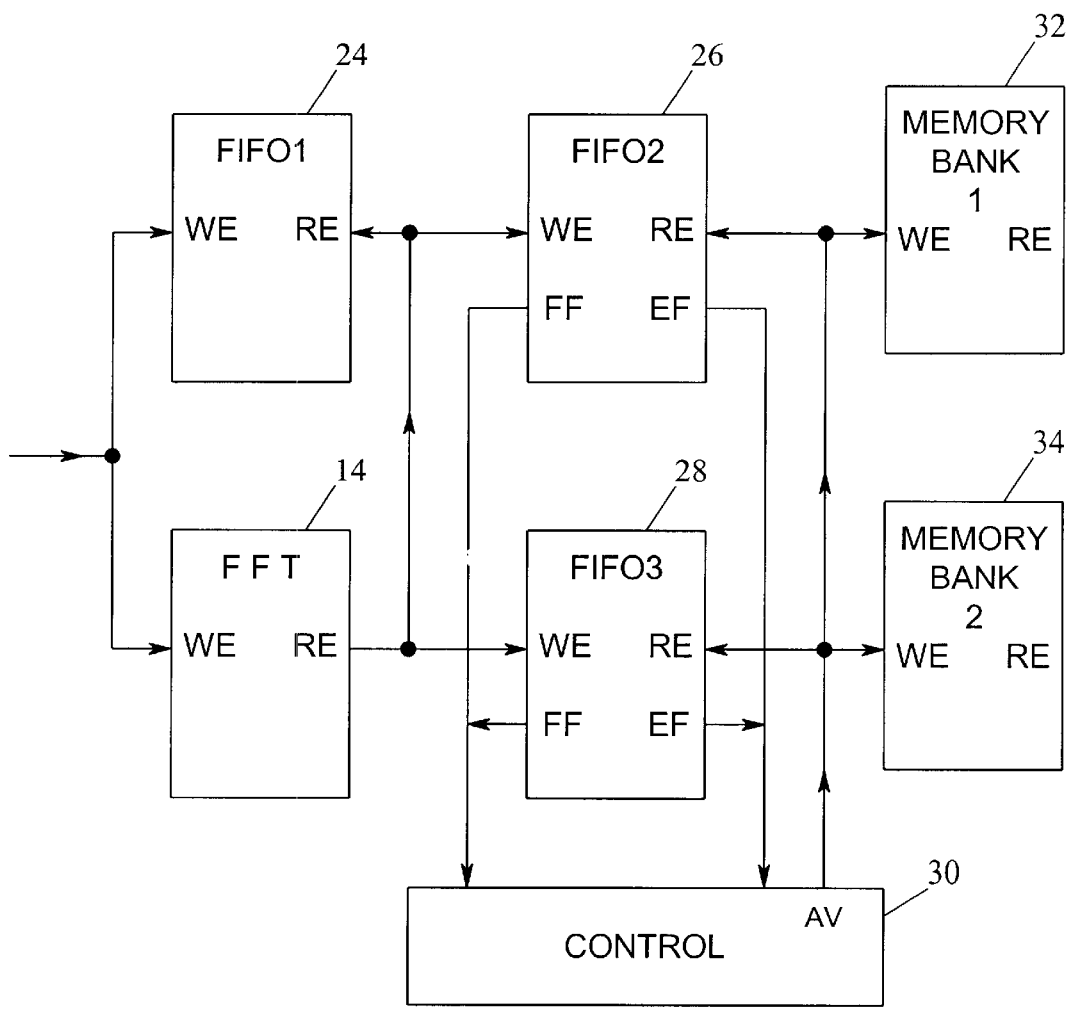
FIG. 2 shows detail operation of a preferred example embodying the invention.
Figure 3:
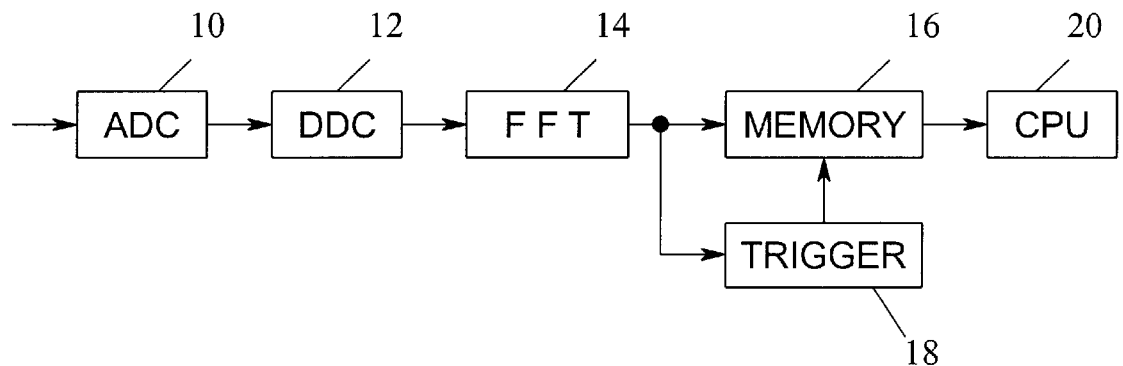
FIG. 3 is a schematic block diagram of an example of a conventional real time FFT analyzer.
Figure 4:
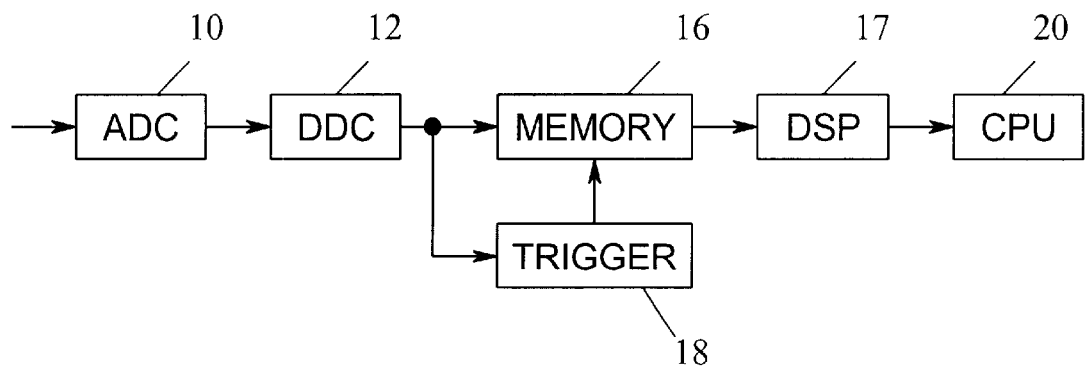
FIG. 4 is a schematic block diagram of an example of a conventional vector signal analyzer.

FIG. 2 shows a detailed block diagram of an example embodying the invention. FIG. 2 shows flows of control signals, but flows of a signal under test and the processed data are abbreviated. As for the data flows in the process of the signal under test, please refer to FIG. 1.

The digital down converter (DDC) 12 of FIG. 1 provides a write enable signal to write enable terminals (WE) of the FFT processor 14 and a FIFO1 (24) when it provides the time domain data to the FFT processor 14 and the FIFO1 (24). Then the FFT processor 14 and the FIFO1 (24) receive the time domain data sequentially. The FFT processor 14 outputs a read enable signal after the FFT process. The read enable signal is provided to a read enable terminal (RE) of the FIFO1 (24), a write enable terminal (WE) of a FIFO2 (26) and a write enable terminal (WE) of a FIFO3 (28). Then the FFT processor 14 provides the FFT processed frequency data to the FIFO3 (28) while the delayed time domain data read out from the FIFO1 (24) is send to the FIFO2 (26). Wherein it is desirable to make the capacities of the memory FIFO1 (24), FIFO2 (26) and FIFO3 (28) equal to the data volume of the one frame, for example, 1024 points.

If the FIFO2 (26) and the FIFO3 (28) fill with the data, they generate full flag signals (FF) that are provided to a control circuit 30. And if the FIFO2 (26) and the FIFO3 (28) empty the data, they generate empty flag signals (EF) that are provided to the control circuit 30. If the control circuit 30 receives the full flag signal, it generates a data available signal (AV). The AV signal is provided to read enable terminals (RE) of the FIFO2 (26) and the FIFO3 (28), and write enable terminals of a memory bank 1 (32) and a memory bank 2 (34). Therefore the data are read out from the FIFO2 (26) and the FIFO3 (28), the memory bank 1 (32) stores the delayed time domain data, and the memory bank 2 (34) stores the frequency domain data. The memories 32 and 34 can consist of the independent memories as shown in FIG. 2 or be different memory areas of a double port memory as shown in FIG. 1.

The FIFO2 (26) and the FIFO3 (28) have different clock frequencies between the data inputs and the data outputs. That is, the clock frequency of the read out is set lower than that of the write. This allows proper data storage into a lower clocked memory. For example, the clock frequency of the data from the FFT processor 14 to the FIFO3 (28) may be 40 MHz while the clock frequency of the output data from the FIFO3 (28) may be 14 MHz. Otherwise, the FIFO2 (26) and the FIFO3 (28) are not necessary if the clock frequency conversion is not necessary.

Although the invention has been shown and described with using preferred embodiments, it would be understand for the skilled in the art that the present invention is not limited in the above embodiments and has many other modifications according the principle.

A real time signal analyzer according to the present invention can provide simultaneous real time generation of the time domain and frequency domain data that are time correspondent and simultaneous. Therefore a new type real time signal analyzer can be realized that has both merits of a conventional real time FFT analyzer and a conventional vector signal analyzer and clears both demerits of them.

INDUSTRIAL APPLICABILITY

As described above, a real time signal analyzer according to the present invention can provide simultaneous real time generation of the time domain data and the frequency domain data and store them. This allows to identify a frequency domain data that has time correspondence to a specific time domain data, while to identify a time domain data that has time correspondence to a specific frequency domain data. Therefore it provides a new type signal analysis that used to be impossible, that is, real time analysis of time domain and frequency domain that have time correspondence each other.

What is claimed is:

1. A real time signal analyzer comprising:
   a FFT processor for FFT processing time domain data in real time;
   a delay means for delaying the time domain data;
   a frequency domain data memory means for storing frequency domain data from the FFT processor that has FFT processed; and
   a time domain data memory means for storing delayed time domain data read out from the delay means;
   wherein the delay time of the delay means is set up according to the process time of the FFT processor.

2. A real time signal analyzer according to claim 1, wherein the frequency domain data memory means and the time domain data memory means start the storage of the delayed time domain data and the frequency domain data, respectively, at the substantial same time.

3. A real time signal analyzer according to claim 1 further comprising:
   an analog to digital converter for receiving an analog signal and producing the time domain data.

4. A real time signal analyzer according to claim 3 further comprising:
   a frequency converter for converting the frequency of the output data of the analog to digital converter by decimating the data according to a variable decimation factor.

5. A real time signal analyzer according to claim 1 further comprising:
   a first clock frequency converter provided between the delay means and the time domain data memory means; and
   a second clock frequency converter provided between the FFT processor and the frequency domain data memory means;
   wherein the input data speeds of the first and second clock frequency converters are slower than the output data speeds of that.

6. A real time signal analyzer according to claim 5, wherein the first and second clock frequency converters are FIFO memories.

7. A real time signal analyzer comprising:

an analog to digital converter for converting an input analog signal into digital data;

a frequency converter for converting output data of the analog to digital converter by decimation process according to a variable decimation factor;

a FFT processor for FFT processing time domain data from the frequency converter;

a delay means for delaying the time domain data, a first clock frequency converter for storing the time domain data from the delay means according to the process completion of the FFT processor;

a second clock frequency converter for storing frequency domain data from the FFT processor according to the process completion of the FFT processor;

a time domain data memory means for receiving the time domain data from the first clock frequency converter; and a frequency domain data memory means for receiving the frequency domain data from the second clock frequency converter;

wherein the delay time of the delay means is set up according to the process time of the FFT processor.

8. A real time signal analyzer according to claim 7 wherein the frequency converter has a data buffer memory for storing the time domain data after the frequency conversion.

9. A real time signal analyzer according to claim 1, wherein the delay means is a FIFO memory.

* * * * *